United States Patent
Meiyappan

(10) Patent No.: US 11,848,723 B2
(45) Date of Patent: Dec. 19, 2023

(54) SYSTEMS AND METHODS OF TESTING CABLES IN TELECOMMUNICATION SYSTEMS AND SYSTEMS THAT CONTAIN SAID CABLES

(71) Applicant: ECSite, Inc., Santa Clara, CA (US)

(72) Inventor: Subramanian S Meiyappan, San Jose, CA (US)

(73) Assignee: ECSite, Inc., Santa Clara, CA (US)

( * ) Notice: Subject to any disclaimer, the term of this patent is extended or adjusted under 35 U.S.C. 154(b) by 0 days.

(21) Appl. No.: 17/736,333

(22) Filed: May 4, 2022

(65) Prior Publication Data

US 2022/0360294 A1    Nov. 10, 2022

Related U.S. Application Data

(60) Provisional application No. 63/185,155, filed on May 6, 2021.

(51) Int. Cl.
*H04B 3/46* (2015.01)
*G01R 31/00* (2006.01)
*G01R 31/12* (2020.01)

(52) U.S. Cl.
CPC ............. *H04B 3/46* (2013.01); *G01R 31/001* (2013.01); *G01R 31/12* (2013.01)

(58) Field of Classification Search
CPC ........ H04B 3/46; G01R 31/001; G01R 31/12; G01R 31/002; G01R 31/50; G01R 31/58
See application file for complete search history.

(56) References Cited

U.S. PATENT DOCUMENTS

| | | | |
|---|---|---|---|
| 4,904,927 A | | 2/1990 | Garbe et al. |
| 5,414,343 A | * | 5/1995 | Flaherty ................. G01R 31/58 324/66 |
| 5,530,367 A | * | 6/1996 | Bottman ................ G01R 31/58 324/543 |
| 5,548,222 A | * | 8/1996 | Jensen ................... H04B 3/487 379/22.01 |
| 5,773,985 A | | 6/1998 | Bradley |
| 6,233,312 B1 | * | 5/2001 | Chaskell ................ G01R 31/58 379/22 |
| 2004/0054490 A1 | | 3/2004 | Bradley et al. |
| 2004/0243326 A1 | | 12/2004 | Daoud et al. |
| 2018/0227014 A1 | * | 8/2018 | Fertner ..................... H04B 3/46 |

FOREIGN PATENT DOCUMENTS

EP    2304456 A2    4/2011

OTHER PUBLICATIONS

European Search Report Corresponding with Application No. EP22171752 dated Oct. 14, 2022 (2 pages).

* cited by examiner

*Primary Examiner* — Khanh C Tran
(74) *Attorney, Agent, or Firm* — Dority & Manning, P.A.

(57) ABSTRACT

Systems and methods of testing cables are provided. An exemplary testing system for testing radio frequency (RF) cables in a telecommunication system including a cable under test includes a termination element configured to be coupled to a distal end of the cable under test; and a controller in communication with the termination element, wherein the controller switches the termination element between two or more termination states selected from the group consisting of an open termination state, a short termination state, a load termination state, and a through state.

20 Claims, 4 Drawing Sheets

SYSTEMS AND METHODS OF TESTING CABLES IN TELECOMMUNICATION SYSTEMS AND SYSTEMS THAT CONTAIN SAID CABLES

CROSS-REFERENCE TO RELATED APPLICATIONS

The present application claims priority to U.S. Provisional Patent Application 63/185,155 filed on May 6, 2021, the disclosure of which is incorporated by reference herein in its entirety

FIELD

The present invention relates to telecommunication systems, and more particularly, to in-field cabling and termination of coaxial cables carrying radio frequency (RF) signals.

BACKGROUND

Telecommunication cables are manufactured in factories and need to be tested. Radio frequency (RF) coaxial cables are used in cell-towers, in-building systems, cable TV systems, satellite communication base station systems, and the like.

When cables are terminated (sometimes referred to as "connectorized"), RF tests are conducted with specialized equipment, such as Vector Network Analyzers (VNAs). A VNA typically includes a plurality of ports, such as two ports, with a first port used to generate a signal and a second, different, port to provide various terminations such as open, short, or load.

In a laboratory environment, the use of a two-port VNA is suitable, however in the field environment, the use of two-port VNA is not feasible for practical reasons. For example, the cables are sometimes more than one hundred feet long and the ends may be on different floors in a building or at the top of a vertical tower. Moreover, the thickness of the cables is often greater than one inch, rendering their bend radius difficult to perform two-port VNA testing. That is, the cables cannot be readily bent to attach to the VNA as the cables have a minimum bend radius which must not be exceeded.

In the field, a one-port VNA may be used. One end of the network analyzer can be connected to the VNA and the other end to a termination such as an RF open, RF short or an RF load. The three terminations are usually available in one physical unit called an Open-Short-Load (OSL). The OSL may be referred to as an OSLT when it also has a through port. Sometimes the OSL is referred to as a T-load due to the shape of the OSL in the form of the letter 'T'. A through port can allow for normal operation of the telecommunication system, since it routes the RF to its destination—typically an antenna.

The one-port test of an RF cable typically involves using a one-port VNA connected to the cable under test using a phase-stable cable on one end and the OSL on the other end. The OSL is switched from open to short to load, manually, depending on the type of the RF test that is being performed. For an RF cable test, it is common to see tests for multiple frequency bands and multiple terminations such as open or short or load. For example, a return-loss (RL) test can be performed with the OSL connected as a load, a Distance-to-Fault (DTF) measurement can be performed with a short and an insertion loss/cable loss (CL) can be performed with an open. These cables are hundreds of feet in length and may span between different floors of a building.

The testing is usually performed with two technicians, one on each end of the cable. The technicians communicate using a wireless communication system (such as, e.g., a walkie talkie). A first technician on the end of the cable having the VNA can change between two or more frequencies. The first technician can also change between test modes (such as RL, DTF, CL). The first technician can instruct a second technician on the other end of the cable to connect the correct termination (such as open, load or short) based on the particular test plan being implemented. The same test process is sometimes followed for RF components as well. This process can be laborious, time-consuming and prone to human error, specifically when performed in the field.

RF cable installation technicians continue to demand more efficient, easier means to handle RF cable installation.

BRIEF DESCRIPTION

Aspects and advantages of the invention in accordance with the present disclosure will be set forth in part in the following description, or may be obvious from the description, or may be learned through practice of the technology.

In accordance with one embodiment, a testing system for testing radio frequency (RF) cables in a telecommunication system including a cable under test is provided. The testing system includes a termination element configured to be coupled to a distal end of the cable under test; and a controller in communication with the termination element, wherein the controller switches the termination element between two or more termination states selected from the group consisting of an open termination state, a short termination state, a load termination state, and a through state.

In accordance with one embodiment, a method of testing RF cables in a telecommunication system including a cable under test is provided. The method includes installing a termination element to a distal end of the cable under test; communicating with the termination element from a test instrument coupled to a proximal end of the cable under test, the proximal end of the cable under test being opposite the distal end; and controlling the termination element from the proximal end of the cable under test.

These and other features, aspects and advantages of the present invention will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present invention, including the best mode of making and using the present systems and methods, directed to one of ordinary skill in the art, is set forth in the specification, which makes reference to the appended figures, in which.

DETAILED DESCRIPTION

Figure 1:
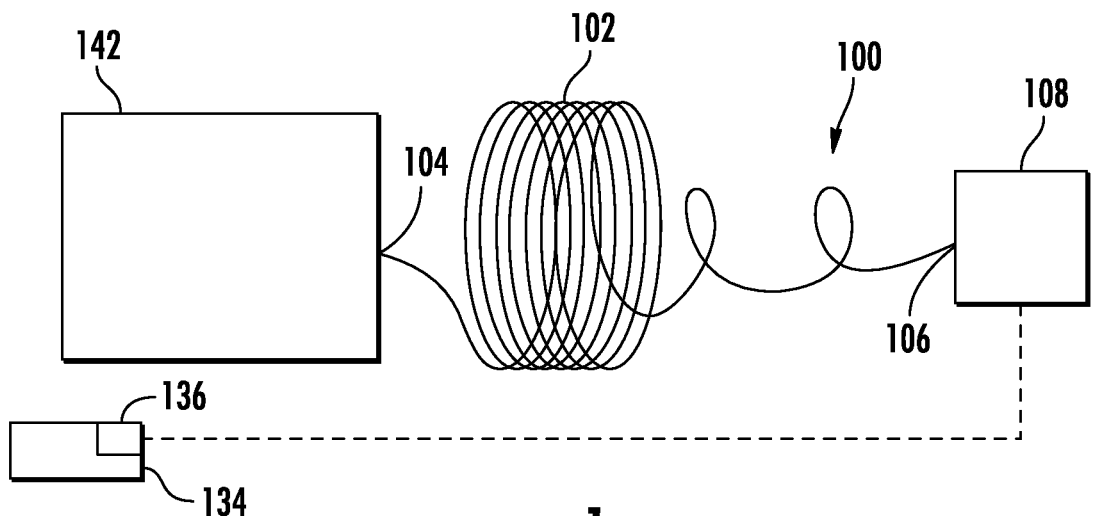
FIG. 1 is a schematic view of a system for testing a cable under test in accordance with embodiments of the present disclosure.

Reference now will be made in detail to embodiments of the present invention, one or more examples of which are illustrated in the drawings. The word "exemplary" is used herein to mean "serving as an example, instance, or illustration." Any implementation described herein as "exemplary" is not necessarily to be construed as preferred or advantageous over other implementations. Moreover, each example is provided by way of explanation, rather than limitation of, the technology. In fact, it will be apparent to those skilled in the art that modifications and variations can be made in the present technology without departing from the scope or spirit of the claimed technology. For instance, features illustrated or described as part of one embodiment can be used with another embodiment to yield a still further embodiment. Thus, it is intended that the present disclosure covers such modifications and variations as come within the scope of the appended claims and their equivalents. The detailed description uses numerical and letter designations to refer to features in the drawings. Like or similar designations in the drawings and description have been used to refer to like or similar parts of the invention.

As used herein, the terms "first", "second", and "third" may be used interchangeably to distinguish one component from another and are not intended to signify location or importance of the individual components. The singular forms "a," "an," and "the" include plural references unless the context clearly dictates otherwise. The terms "coupled," "fixed," "attached to," and the like refer to both direct coupling, fixing, or attaching, as well as indirect coupling, fixing, or attaching through one or more intermediate components or features, unless otherwise specified herein. As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is fake (or not present), A is false (or not present) and B is true (or present), and both A and B are true (or present).

Terms of approximation, such as "about," "generally," "approximately," or "substantially," include values within ten percent greater or less than the stated value. When used in the context of an angle or direction, such terms include within ten degrees greater or less than the stated angle or direction. For example, "generally vertical" includes directions within ten degrees of vertical in any direction, e.g., clockwise or counter-clockwise.

Benefits, other advantages, and solutions to problems are described below with regard to specific embodiments. However, the benefits, advantages, solutions to problems, and any feature(s) that may cause any benefit, advantage, or solution to occur or become more pronounced are not to be construed as a critical, required, or essential feature of any or all the claims.

In general, embodiments in accordance with the present disclosure allow for testing of cables in telecommunication systems using a remotely controlled termination device. In this regard, testing can be performed quicker, easier, and more efficiently. Whereas traditional testing systems and methods require operators on both ends of the cable under test, systems and methods described in embodiments herein allow for testing by a single operator. Moreover, where testing requires placement of a termination device at a dangerous location, e.g., at an antenna located on top of a large structure, systems and methods described herein can reduce risk by eliminating the need for the testing operator to remain at the dangerous location during testing.

Referring now to the drawings, FIG. 1 illustrates a schematic view of a testing system 100 for testing radio frequency (RF) in cables of telecommunications systems in accordance with an embodiment. By way of example, the telecommunications system can include a coaxial network including one or more coaxial cables and supporting structure, such as cell-towers, in-building systems, cable TV systems, satellite communication base station systems, and the like. The system 100 can be implemented with one or more cables under test 102 to determine one or more operating parameters of the cable(s) under test 102. The cable under test 102 can generally include a proximal end 104 and a distal end 106. In certain instances, the proximal and distal ends 104 and 106 can correspond with transmission ends of the cable under test 102. In other embodiments, the proximal and distal ends 104 and 106 can correspond with portions of the cable under test 102 located near the ends of the cable under test 102. That is, the system disclosed herein may be implemented at locations spaced apart from the transmission ends of the cable where the signal is fed and received.

The testing system 100 can include a termination element 108 configured to be coupled to the distal end 106 of the cable under test 102. The termination element 108 can include, for example, an open-short-load (OSL) termination device. In an embodiment, the termination element 108 can include a single physical unit. The OSL can be used to test the one or more operating parameters of the cable under test 102. In an embodiment, the OSL can include a through port which allows for passage of the signals traveling through the cable. Thus, the OSL can route the signal to its final destination, e.g., when the OSL is not used for active testing purposes. OSL devices with through ports may be referred to herein as OSLTs.

The termination element 108 can be switchable between two or more termination states. Each termination state can be used for performing a different test on the cable under test 102. By way of non-limiting example, these termination states may include any one or more of an open termination state, a short termination state, or a load termination state. In certain instances, a return-loss (RL) test can be performed with the termination element 108 connected as a load. In other instances, a distance-to-fault (DTF) measurement can be performed with the termination element 108 connected as a short. In yet other instances, an insertion loss/cable loss (CL) can be performed with the termination element 108 connected as an open. During testing, an operator may switch between these termination states to test the cable under test 102 in accordance with a desired testing protocol.

Figure 2:
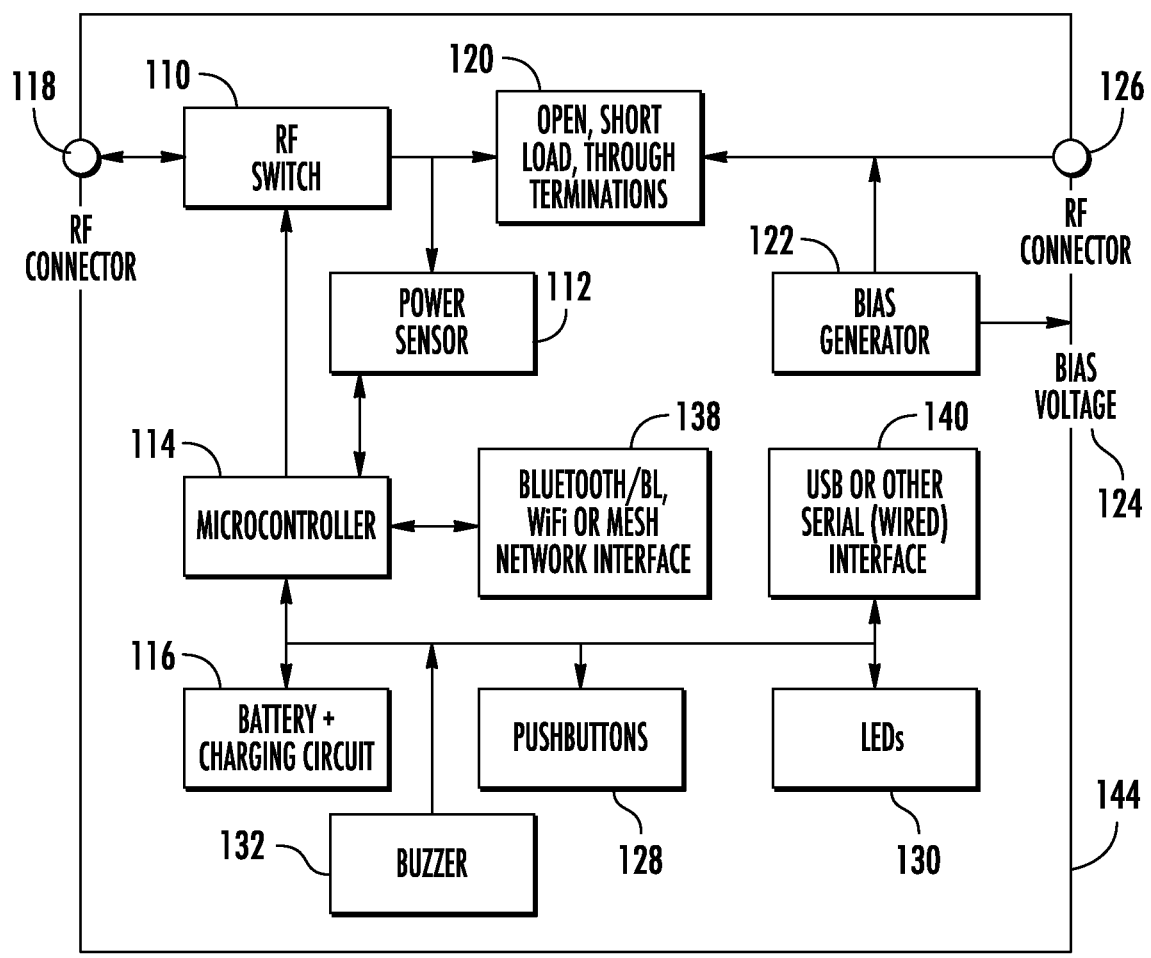
FIG. 2 is a schematic view of a termination element for the system for testing the cable under test of FIG. 1 in accordance with embodiments of the present disclosure.

FIG. 2 depicts a schematic view of the termination element 108 in accordance with an embodiment. Referring to FIG. 2, the termination element 108 can include an RF switch 110, an RF power sensor 112, a processor 114, and a power source 116. The RF switch 110 can be coupled with an RF connector 118. The RF connector 118 can be an external connector to which the cable under test 102 (FIG. 1) can be connected, e.g., during testing or permanently. The processor 114 can be coupled with the RF switch 110. The power source 116 can include, for example, a battery and a charging circuit. The power source 116 can be coupled with the processor 114. The RF power sensor 112 can be coupled with the RF switch 110 and the processor 114.

The termination element 108 can further include open, short, load, through (OSLT) terminations 120 and a bias generator 122 coupled with a bias voltage at a bias voltage connection port 124. By way of non-limiting example, the bias voltage may control, e.g., turn on, one or more amplifiers coupled downstream from the termination element 108. The termination element 108 may be configured to pass the bias voltage through when the bias is generated by the test instrument. In another embodiment, the termination element 108 can provide a bias voltage to an amplifier (such as, e.g., a Tower Mounted Amplifier—TMA) through its bias voltage connection port 124 so as to turn the TMA ON or OFF remotely to perform certain RF tests.

The terminations 120 can be coupled with an RF connector 126 which can be coupled downstream of the termination element 108, e.g., to an antenna. The termination 120 can be disposed between the RF switch 110 and the RF connector 126. In this regard, inputs received at the RF connector 118 can pass through the RF switch 110 and the terminations 120 prior to passing through the termination element 108 at the RF connector 126.

In certain instances, the termination element 108 can further include a user interface which allows the operator to operate the termination element 108. The user interface can include, for example, one or more pushbuttons 128. The pushbuttons 128 may be exposed from a body of the termination element 108 to allow the operator ready access thereto. In certain instances, the termination element 108 can further include one or more visual indicators 130 to allow the operator to see a status or operating parameter of the termination element 108. By way of non-limiting example, the visual indicator(s) 130 can include light emitting diodes (LEDs). An audible indicator 132 can be further included to alert the operator of a particular status or operating parameter of the termination element 108. By way of non-limiting example, the audible indicator 132 can include a buzzer.

In an embodiment, the termination element 108, or components thereof, can be integrated into one or more printed circuit boards (PCBs). In another embodiment, the termination element 108 can be constructed from discrete components in electrical communication with one another.

Referring again to FIG. 1, the system 100 can further include a controller 134 in communication with the termination element 108. The controller 134 can be in wireless communication with the termination element 108. By way of non-limiting example, wireless communication can occur through Bluetooth, over WiFi, through cellular signal, or a mesh network interface. In certain instances, the controller 134 can include a remote. In other instances, the controller 134 can be integrated into an existing smart device, such as a smart phone. The controller 134 can include, for example, a software application executable by the smart device to instruct the termination element 108 to perform a particular operation, such as to switch between two or more termination states.

The controller 134 can be movable with respect to the termination element 108. In this regard, the operator performing the test can maneuver within the environment associated with the cable under test 102 without having to remain at the termination element 108 while maintaining the ability to control the termination element 108. By way of example, the operator can control the termination element 108 using the controller 134 when the operator is located at the proximal end 104 of the cable under test 102. In this regard, the operator can be located at a position associated with injection of the signal into the cable under test 102 while affecting the termination element 108 to a desired termination state. This may be particularly suitable for situations where the termination element 108 is in a hard to reach or dangerous location, such as on a rooftop, a tower, or the like. Using the controller 134, the operator can repeatedly affect the termination element 108 without having to expose themselves to increased risk of bodily harm.

The controller 134 can have a communication element 136 which can wirelessly communicate with a wireless interface 138 of the termination element 108 (FIG. 2). In certain instances, the termination element 108 may also, or alternatively, include a wired interface 140 which can be connected to the communication element 136 through a wired interface, such as a cable.

Referring still to FIG. 1, the system 100 can further include a test instrument 142 configured to execute one or more tests to be performed on the cable under test 102. The test instrument 142 can be disposed at the proximal end 104 of the cable under test 102. For instance, the proximal end 104 of the cable under test 102 can be connected to a port of the test instrument 142. By way of non-limiting example, the test instrument 142 can include a vector network analyzer (VNA). The VNA can include a plurality of ports with at least one port configured to provide signals along the cable under test 102.

In a particular test of the system 100, the test instrument 142 can inject a signal into the cable under test 102 which can be measured by the power sensor 112 of the termination element 108. The power sensor 112 can communicate the sensed power to the processor 114 which can relay information associated with the sensed power to the wireless interface 138 or the wired interface 140 to communicate the information to the operator.

Figure 3:
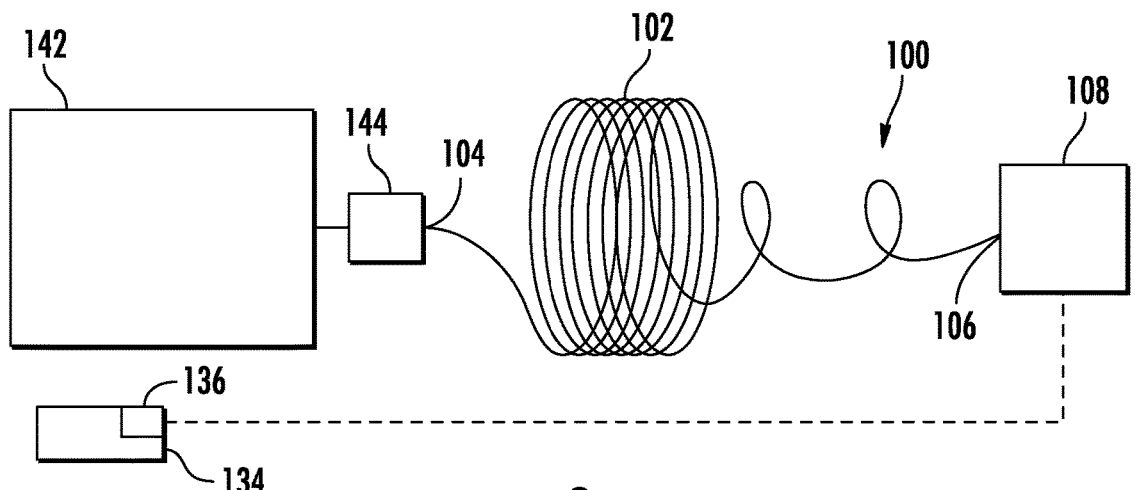
FIG. 3 is a schematic view of another system for testing a cable under test in accordance with embodiments of the present disclosure.

FIG. 3 depicts an embodiment of the system 100 in accordance with another embodiment. As depicted, the system 100 further includes an injector module 144 coupled between the test instrument 142 and the cable under test 102. The injector module 144 can perform at least one of the following functions during testing of the cable under test 102. The injector module 144 can provide power, e.g., direct current, to the termination element 108, e.g., through the cable under test 102. The injector module 144 can receive power, e.g., direct current, from the test instrument 142, e.g., through a USB or other dedicated power connection. The injector module 144 can pass commands from the test instrument 142, controller 134, or another element to the termination element 108, e.g., through the cable under test 102. The injector module 144 can receive responses from the termination element 108, e.g., through the cable under test 102. The injector module 144 may further transmit the received responses to the test instrument 142, the controller 134, or another element associated with the system. The injector module 144 can provide feedback to the operator through responses to commands, LEDs, buzzers, or the like.

Figure 4:
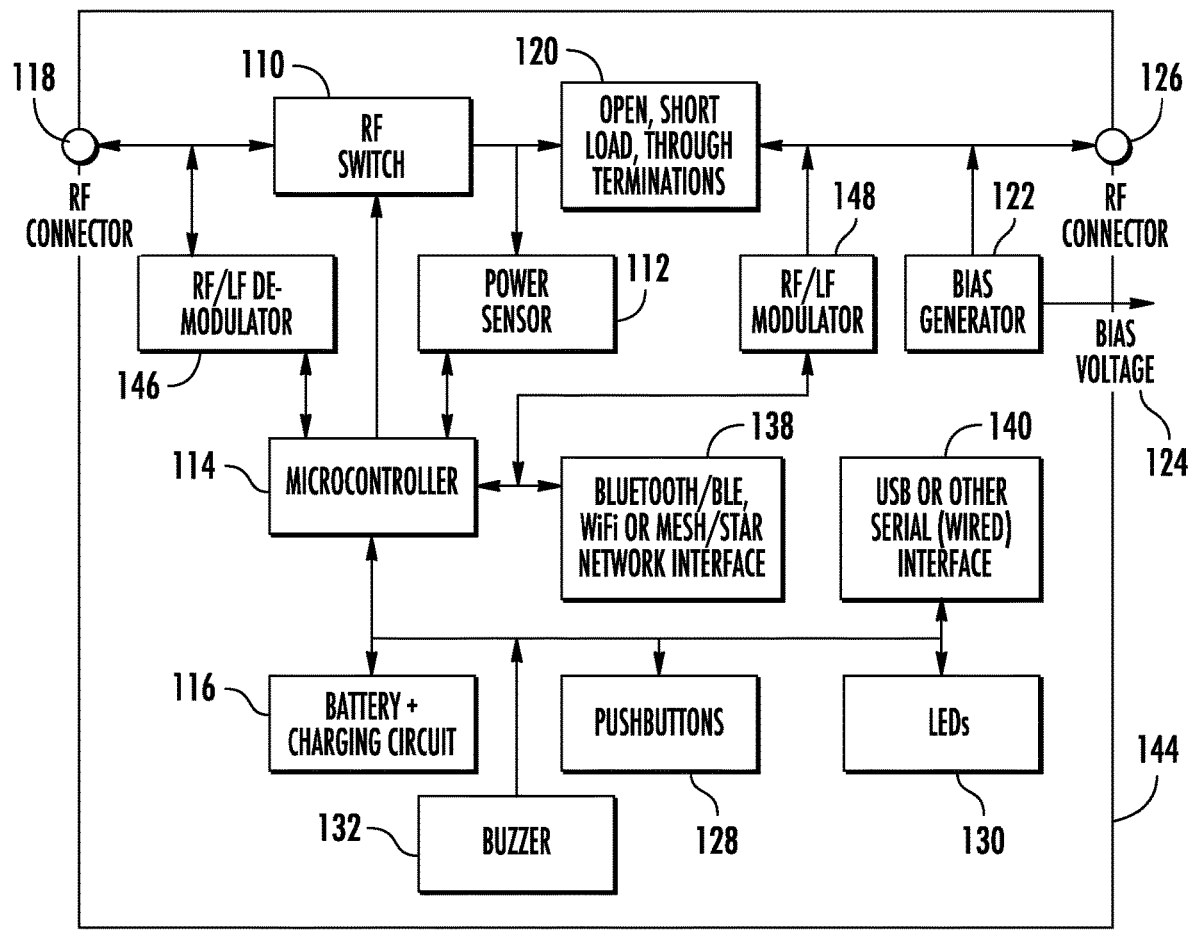
FIG. 4 is a schematic view of a termination element for the system for testing the cable under test of FIG. 3 in accordance with embodiments of the present disclosure.

FIG. 4 depicts an exemplary schematic view of the injector module 144 in accordance with an embodiment. As depicted, the injector module 144 can include similar elements as compared to the termination element 108, such as for example, an RF switch 110, a power sensor 112, a processor 114, a power source 116, terminations 120, a bias generator 122, and the like. The injector module 144 can further include a de-modulator 146 and a modulator 148. The de-modulator 146 and modulator 148 can include RF/LF modulator/demodulators.

As previously described, the termination element 108 can be an OSL device, and more particularly, an OSLT. In an embodiment, the injector module 144 can also be an OSL device. Specifically, the injector module 144 should be an OSLT. In certain instances, the termination element 108 and the injector module 144 can be essentially similar devices, including similar, or same, structures and operating protocols.

Using the injector module 144, the operator can affect the termination element 108 which can respond to commands by switching to an appropriate termination state (e.g., open, short or load). Using this technique, testing efficiency can be drastically increased as the operator can remain at the proximal end 104 of the cable under test 102 while affecting the termination element 108 disposed at the distal end 106 of the cable under test 102. Communication to the termination element 108 can come from, e.g., the injector module 144. The communication can include, e.g., voltage signals (e.g., DC voltage signals) for various modes or frequency modulated messages in the form of frequency-shift keying (FSK) modulation or phase-shift keying (PSK) modulation.

In an embodiment, messages coded in low frequency pulses or RF modulated signals can be used to communicate between the injector module 144 and the termination element 108. Sophisticated two-way communication mechanisms can also be implemented.

In an embodiment, the termination element 108 can be commanded to measure RF power of a signal received from the test instrument 142 through the cable under test 102 using the RF power sensor 112. The termination element 108 can report the power back to the operator through the test instrument 142, the smart device, or the like.

In an embodiment, one of the injector module 144 and termination element 108 can be controlled using a first device, such as a smart device running a software application. The other of the injector module 144 and termination element 108 can be controlled using a second device, different from the first device. By way of non-limiting example, the second device can be another smart device running the same or different software application. In certain instances, the first and second devices can operate on a common communication protocol, such as on a same network. In other instances, the first and second devices can operate on different communication protocols. For example, the first device can operate using Bluetooth and the second device can operate using WiFi. Alternatively, the first and second devices can utilize the same type of network but different available protocols available in the network. In an embodiment, both the injector module 144 and the termination element 108 can be controlled using the same device, such as using a software application installed on a single smart device.

In certain applications, at least one of the termination element 108 and the injector module 144 can be operable using a third-party software. The third-party software may also control the test instrument 142. In this regard, the operational efficiency can be further improved by reducing the number of components required to test the cable under test 102 and the system 100.

Figure 5:
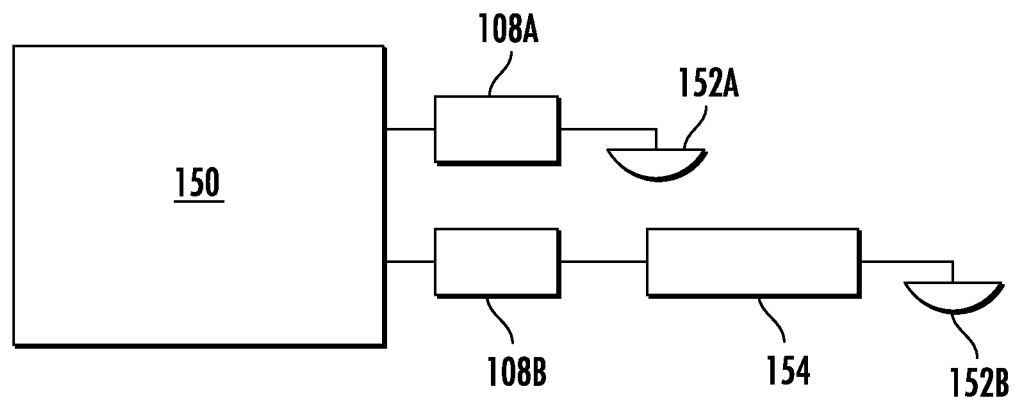
FIG. 5 is a schematic view of a system including cables under test coupled between a signal distribution network and antennas in accordance with embodiments of the present disclosure.

In accordance with an embodiment, the termination element 108 can be left in place in-line on a network of RF components, e.g., to monitor performance. Referring to the exemplary embodiment depicted in FIG. 5, two termination elements 108A and 108B are depicted in-line between a signal distribution network 150, including for example a splitter, cables, amplifiers and the like, and antennas 152A and 152B. A splitter or coupler 154 is disposed between the termination element 108B and the antenna 152B.

Figure 6:
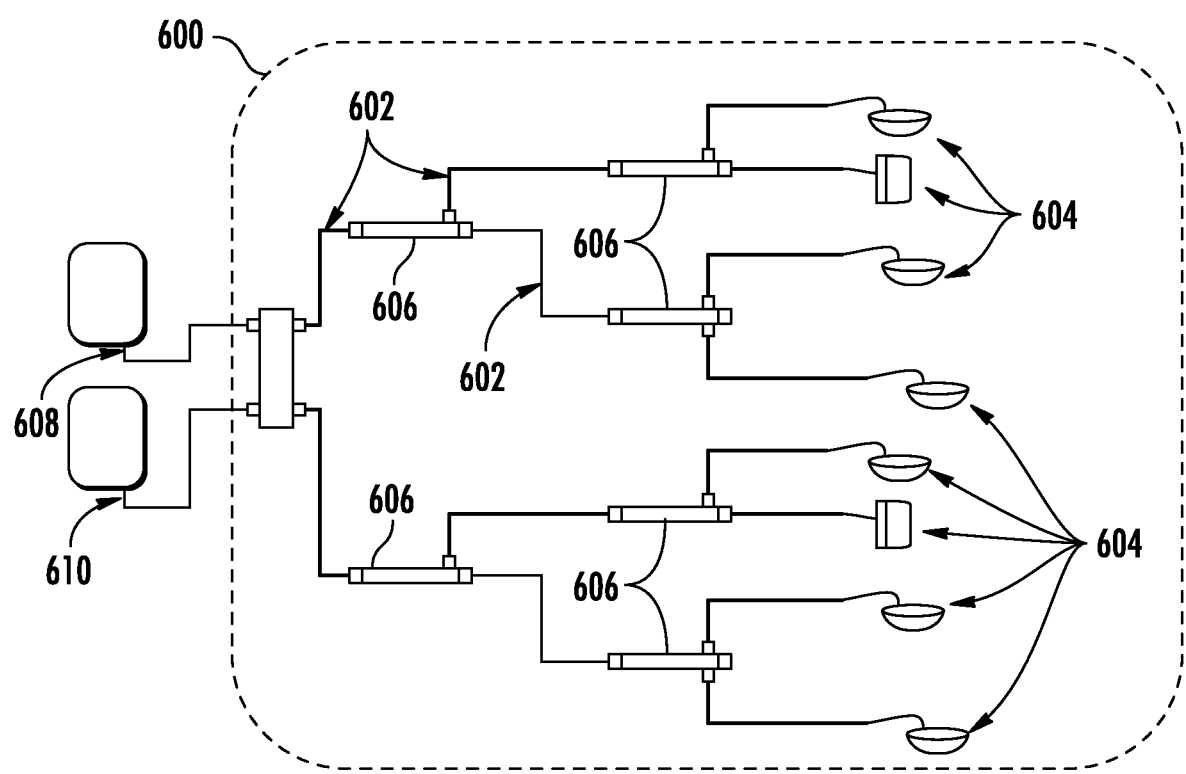
FIG. 6 is a schematic view of a system for testing cables under test in accordance with embodiments of the present disclosure.

FIG. 6 illustrates a system 600 including a plurality of cables 602 arranged in an exemplary manner. Each of the cables 602 is depicted extending between two nodes. The nodes can include, for example, antennas 604, splitters or couplers 606, and the like. Testing can be performed on each of the cables 602 individually or together to measure operational characteristics of each cable 602, a plurality of cables 602, or the overall system 600. In an embodiment, the system 600 can be tested from a single, first testing location 608. In another embodiment, the system 600 can be tested from a plurality of locations including the first testing location 608 and a second testing location 610.

The termination element 108 described above can be implemented within the system 600, e.g., at the antennas 604, adjacent to the splitters or couplers 606, or the like. The termination element 108 can be controlled, e.g., by the controller 134. In an embodiment, the termination element 108 can be remotely controlled by the controller 134. In an embodiment, a plurality of termination elements can be implemented within the system 600 to test different cable pathways. The plurality of termination elements can be operated using a common controller or different controllers.

Referring again to FIG. 1, in certain instances, the termination element 108 can be controlled by a bias voltage generated at the test instrument 142. Some test instruments 142 may be capable of inserting a fixed direct current (DC) voltage, known as a bias voltage, into the RF data channel using a device such as, e.g., a bias-tee. The bias-tee can include a plurality of ports, such as an RF input, and RF output, and an input for the bias voltage. The bias-tee can combine the incoming RF and the bias voltage together and drive the resultant DC/RF mix from the output.

Figure 7:
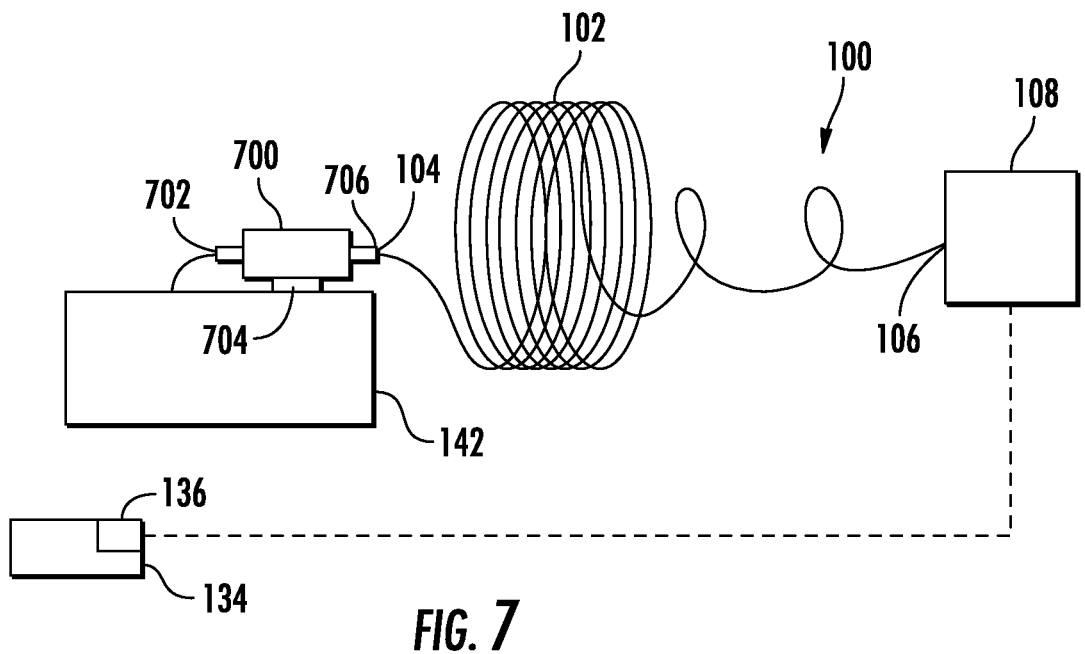
FIG. 7 is a schematic view of another system for testing a cable under test in accordance with embodiments of the present disclosure.

FIG. 7 depicts an exemplary view of a bias-tee 700 receiving a bias voltage 702 from the test instrument 142. The bias-tee 700 can further receive an RF input 704 and have an RF and bias voltage output 706. In an embodiment, the bias-tee RF input 704 can be coupled to, e.g., directly coupled to, the test instrument 142. In some instances, the RF and bias voltage output 706 can be injected directly into the cable under test 102. In other instances, the RF and bias voltage output 706 can be injected into the cable under test 102 through an injector module (not depicted). The termination element 108 can decode the bias voltage on the cable under test to determine its behavior, selecting between open, short, load or through operation.

In an embodiment, the test instrument 142 can drive a plurality of bias voltage levels into the bias-tee. The termination element 108 can decode the bias voltage level and use the decoded information to configure its own behavior. For example, a first bias voltage level can cause the termination element 108 to turn on its load, a second bias voltage level can cause the termination element 108 to set its input to the open state, a third bias voltage level can cause engage the internal short of the termination element 108, and a fourth bias voltage level can enable the through port of the termination element 108. In certain instances, the termination element 108 can decode the absence of a bias voltage (e.g., that the bias voltage is zero) as a unique command. By way of non-limiting example, the absence of the bias voltage might enable the through port of the termination element 108, which may correspond with its normal operating state, where incoming RF simply passes through the system.

RF equipment downstream of the termination element 108 can include a DC block to prevent DC voltage on the cable (e.g., the bias voltage inserted by the test equipment) from being propagated further downstream.

Figure 8:
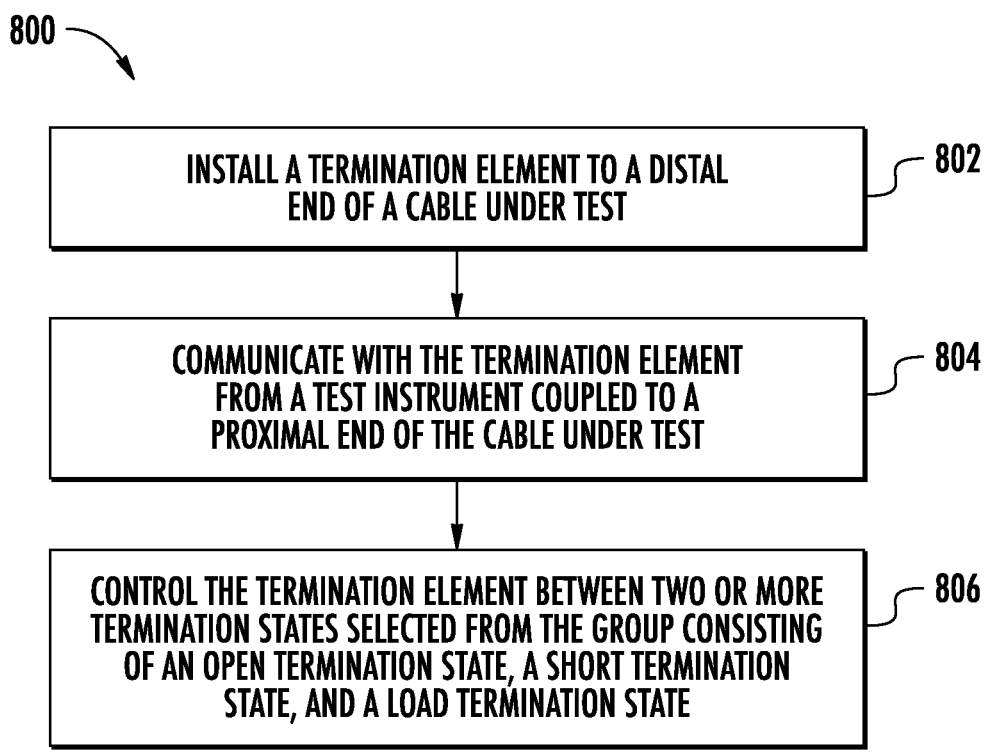
FIG. 8 is a flowchart of method of testing RF cables in a telecommunication system including a cable under test.

FIG. 8 illustrates a flow chart of a method 800 of testing RF cables in a telecommunication system including a cable under test. The method 800 can include a step 802 of installing a termination element to a distal end of the cable under test. The method 800 can further include a step 804 of communicating with the termination element from a test instrument coupled to a proximal end of the cable under test, the proximal end of the cable under test being opposite the distal end. The method 800 can further include a step 806 of controlling the termination element from the proximal end of the cable under test. In an embodiment, the step 806 of controlling the termination element can include switching the termination element between two or more termination states selected from the group consisting of an open termination state, a short termination state, and a load termination state. The step 806 can be performed, e.g., by a controller in wireless communication with the termination element. Alternatively, or in addition, the step 806 can be performed by a controller in wired communication with the termination element. The controller can include, e.g., a smart device such as a mobile device.

In an embodiment, the method 800 can further include measuring RF power through the cable under test using the termination element, and communicating the measured RF power to an operator located at a proximal end of the cable under test. The operator can remain at the proximal end of the cable under test during testing, relying on the controller to communicate with the termination element.

Further aspects of the invention are provided by one or more of the following embodiments:

Embodiment 1. A testing system for testing radio frequency (RF) cables in a telecommunication system including a cable under test, the testing system comprising: a termination element configured to be coupled to a distal end of the cable under test; and a controller in communication with the termination element, wherein the controller switches the termination element between two or more termination states selected from the group consisting of an open termination state, a short termination state, a load termination state, and a through state.

Embodiment 2. The testing system of any one or more of the embodiments, wherein the controller is movable with respect to the termination element, and wherein an operator controls the termination element through the controller when the operator is located on a proximal end of the cable under test, the proximal end of the cable under test being opposite the distal end.

Embodiment 3. The testing system of any one or more of the embodiments, wherein the controller is in wireless communication with the termination element.

Embodiment 4. The testing system of any one or more of the embodiments, wherein the termination element is electronically switchable between the two or more termination states.

Embodiment 5. The testing system of any one or more of the embodiments, wherein the termination element comprises: an RF switch; an RF power sensor; a processor; and a power source.

Embodiment 6. The testing system of any one or more of the embodiments, further comprising: a test instrument configured to execute one or more tests of the cable under test, the test instrument being disposed at a proximal end of the cable under test, the proximal end of the cable under test being opposite the distal end; and an injector module configured to be coupled between the test instrument and the cable under test, wherein the injector module is configured to communicate with the termination element through the cable under test.

Embodiment 7. The testing system of any one or more of the embodiments, wherein the injector module is configured to: receive power from the test instrument, provide power to the termination element through the cable under test, inject commands from the test instrument into the cable under test, receive responses from the termination element in response to the injected commands, provide feedback in response to the received responses; or any combination thereof.

Embodiment 8. The testing system of any one or more of the embodiments, wherein the termination element comprises an OSL device, and wherein the injector module comprises an OSL device.

Embodiment 9. The testing system of any one or more of the embodiments, wherein communication from the injector module to the termination element comprises a DC voltage signal for various modes or a frequency modulated message including frequency-shift keying (FSK) modulation or phase-shift keying (PSK) modulation.

Embodiment 10. A method of testing RF cables in a telecommunication system including a cable under test, the method comprising: installing a termination element to a distal end of the cable under test; communicating with the termination element from a test instrument coupled to a proximal end of the cable under test, the proximal end of the cable under test being opposite the distal end; and controlling the termination element from the proximal end of the cable under test.

Embodiment 11. The method of any one or more of the embodiments, wherein controlling the termination element comprises switching the termination element between two or more termination states selected from the group consisting of an open termination state, a short termination state, and a load termination state.

Embodiment 12. The method of any one or more of the embodiments, wherein controlling the termination element is performed by a controller in wireless communication with the termination element.

Embodiment 13. The method of any one or more of the embodiments, wherein the controller comprises a mobile device.

Embodiment 14. The method of any one or more of the embodiments, further comprising: measuring RF power through the cable under test using the termination element; and communicating the measured RF power to an operator located at the proximal end of the cable under test.

Embodiment 15. The method of any one or more of the embodiments, wherein communicating with the termination element from the test instrument comprises injecting commands from the test instrument into the cable under test through an injector module.

Embodiment 16. The method of any one or more of the embodiments, wherein the termination element comprises an OSL device, and wherein the injector module comprises an OSL device.

Embodiment 17. The method of any one or more of the embodiments, wherein the termination element is configured to interact with one or more devices, the termination element being disposed along a communication pathway between the cable under test and the one or more devices.

Embodiment 18. The method of any one or more of the embodiments, wherein the termination element is left coupled to the cable under test after testing is complete when the cable under test is in operation.

Embodiment 19. The method of any one or more of the embodiments, wherein the cable under test comprises a plurality of cables under test.

Embodiment 20. The method of any one or more of the embodiments, wherein controlling the termination element is performed at least in part by the test instrument.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. A testing system for testing radio frequency (RF) cables in a telecommunication system including a cable under test, the testing system comprising:
   a termination element configured to be coupled to a distal end of the cable under test; and
   a controller in communication with the termination element,
   wherein the controller switches the termination element between two or more termination states selected from the group consisting of an open termination state, a short termination state, a load termination state, and a through state, and
   wherein the controller is in wireless communication with the termination element.

2. The testing system of claim 1, wherein the controller is movable with respect to the termination element, and wherein an operator controls the termination element through the controller when the operator is located on a proximal end of the cable under test, the proximal end of the cable under test being opposite the distal end.

3. The testing system of claim 1, wherein the termination element is electronically switchable between the two or more termination states.

4. The testing system of claim 1, wherein the termination element comprises:
   an RF switch;
   an RF power sensor;
   a processor; and
   a power source.

5. The testing system of claim 1, further comprising:
   a test instrument configured to execute one or more tests of the cable under test, the test instrument being disposed at a proximal end of the cable under test, the proximal end of the cable under test being opposite the distal end; and
   an injector module configured to be coupled between the test instrument and the cable under test,
   wherein the injector module is configured to communicate with the termination element through the cable under test.

6. The testing system of claim 5, wherein the injector module is configured to:
   receive power from the test instrument,
   provide power to the termination element through the cable under test,
   inject commands from the test instrument into the cable under test,
   receive responses from the termination element in response to the injected commands,
   provide feedback in response to the received responses; or any combination thereof.

7. The testing system of claim 5, wherein the termination element comprises an Open-Short-Load (OSL) device, and wherein the injector module comprises an OSL device.

8. The testing system of claim 5, wherein communication from the injector module to the termination element comprises a DC voltage signal for various modes or a frequency modulated message including frequency-shift keying (FSK) modulation or phase-shift keying (PSK) modulation.

9. A method of testing RF cables in a telecommunication system including a cable under test, the method comprising:
   installing a termination element to a distal end of the cable under test;
   communicating with the termination element from a test instrument coupled to a proximal end of the cable under test, the proximal end of the cable under test being opposite the distal end; and
   controlling the termination element from the proximal end of the cable under test by a controller in wireless communication with the termination element.

10. The method of claim 9, wherein controlling the termination element comprises switching the termination element between two or more termination states selected from the group consisting of an open termination state, a short termination state, and a load termination state.

11. The method of claim 9, wherein the controller comprises a mobile device.

12. The method of claim 9, further comprising:
    measuring RF power through the cable under test using the termination element; and
    communicating the measured RF power to an operator located at the proximal end of the cable under test.

13. The method of claim 9, wherein communicating with the termination element from the test instrument comprises injecting commands from the test instrument into the cable under test through an injector module.

14. The method of claim 13, wherein the termination element comprises an Open-Short-Load (OSL) device, and wherein the injector module comprises an OSL device.

15. The method of claim 9, wherein the termination element is configured to interact with one or more devices, the termination element being disposed along a communication pathway between the cable under test and the one or more devices.

16. The method of claim 9, wherein the termination element is left coupled to the cable under test after testing is complete when the cable under test is in operation.

17. The method of claim 9, wherein the cable under test comprises a plurality of cables under test.

18. The method of claim 9, wherein controlling the termination element is performed at least in part by the test instrument.

19. A testing system for testing radio frequency RF cables in a telecommunication system including a cable under test, the testing system comprising:
- a termination element configured to be coupled to a distal end of the cable under test;
- a controller in wireless communication with the termination element, wherein the controller is adapted to wirelessly switch the termination element between an open termination state, a short termination state, a load termination state, and a through state; and
- a test instrument configured to execute one or more tests of the cable under test, the test instrument being disposed at a proximal end of the cable under test, the proximal end of the cable under test being opposite the distal end,
- wherein the test instrument and the controller are different from one another.

20. The testing system of claim 19, further comprising:
- an injector module configured to be coupled between the test instrument and the cable under test,
- wherein the injector module is configured to communicate with the termination element through the cable under test.

* * * * *